PRINTED CIRCUIT BOARD GUIDE

Filed July 12, 1965

INVENTOR
Leon Novet
BY Lane, Aitken, Dunner & Ziems
ATTORNEYS

United States Patent Office 3,382,476

Patented May 7, 1968

3,382,476

PRINTED CIRCUIT BOARD GUIDE

Leon Novet, Oceanside, N.Y., assignor to Potter Instruments Company, Inc., Plainview, N.Y., a corporation of New York Filed July 12, 1965, Ser. No. 471,041
9 Claims. (Cl. 339—65)

ABSTRACT OF THE DISCLOSURE

The specification and drawings disclose a rack for storing printed circuit boards in parallel spaced apart relation. The rack comprises a pair of flat guides supported in parallel spaced apart relationship with each guide having a plurality of guide tracks formed therein for slidably retaining the upper and lower edges of the individual printed circuit boards. The rack includes terminal connectors mounted between the guides in position to make electrical connection to the leading edge of each of the printed circuit boards when they are fully inserted between the guides. Each guide comprises a sheet of electrical insulating material such as plastic or plastic coated paper having boards or ridges formed thereon by a draw molding operation for defining the guide tracks. A method is also disclosed for cutting the individual guides from a long continuous strip having a large number of guide tracks formed thereon.

The present invention relates to guides for storing printed circuit boards and the like in parallel, spaced apart relation, and more particularly to a flat guide having a plurality of parallel spaced apart guide tracks for receiving and positioning one edge of a printed circuit board.

Many forms of electrical apparatus, and in particular electronic computers, employ printed circuit techniques wherein the printed circuit boards are supported close together in parallel spaced apart relation by a supporting rack which includes terminal connectors. An example of such a prior art construction is the patent to Blain 2,976,510. In this patent, the upper and lower edges of the individual printed circuit boards are slidably retained in grooves machined in flat guide plates overlying the upper and lower edges to maintain the boards in parallel spaced-apart relationship.

It is one object of the present invention to provide a simple low-cost guide which can be employed in place of the machined guide plates of the aforementioned patent for supporting the printed circuit boards in parallel spaced-apart relation.

It is another object of the invention to provide a simplified printed circuit board guide wherein the guide tracks for guiding the individual printed circuit boards are formed in a flat sheet by a draw molding operation.

It is a further object of the invention to provide a printed circuit board guide in the form of an elongated strip or sheet having transverse, parallel guide tracks formed by a plurality of pairs of ridges displaced from the plane of the sheet by a draw-molding operation.

It is a still further object of the invention to provide an elongated strip of the type described above having a large number of parallel spaced-apart guide tracks formed thereon so that the strip can be cut into predetermined lengths to provide individual guides having the desired number of guide tracks thereon.

It is a still further object of the invention to provide a rack for storing printed circuit boards and the like in parallel, closely spaced-apart relation comprising a pair of the aforementioned guides supported in position to overlie the upper and lower edges of the printed circuit boards with the edges slidably retained in the guide tracks on the guides.

Other objects and features of novelty of the present invention will be specifically pointed out or will otherwise become apparent when referring, for a better understanding of the invention, to the following description taken in conjunction with the accompanying drawings, wherein.

Figures 1, 3:
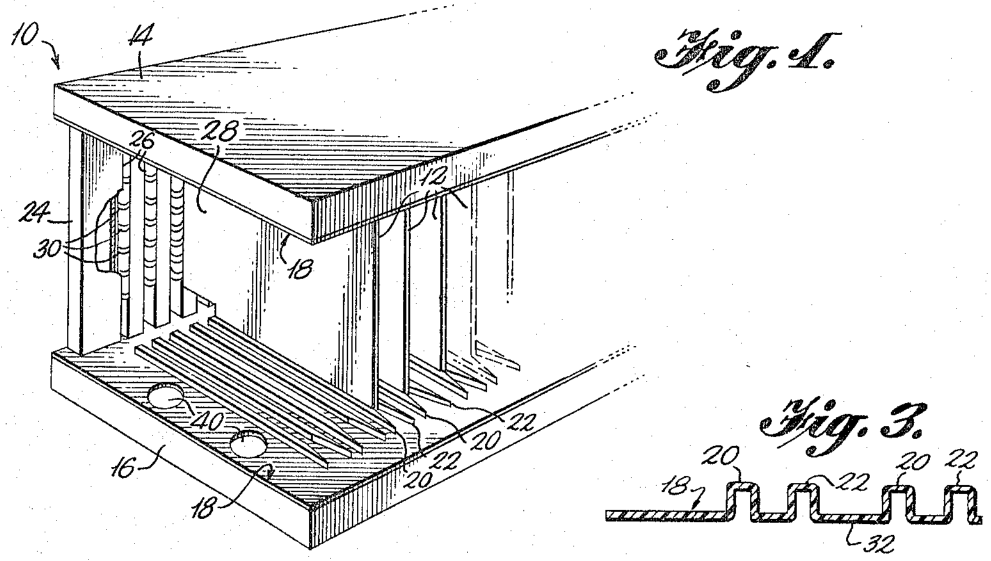
FIG. 1 is a broken, perspective view of a printed circuit board rack embodying features of the present invention.
FIG. 3 is an enlarged, sectional view taken along the line 3—3 of FIG. 2.

Referring to FIG. 1, a rack 10 embodying features of the invention is illustrated for supporting a plurality of printed circuit boards 12 in parallel spaced apart relation. The rack 10 comprises parallel spaced apart supporting members 14 and 16 which may be fixed to the electronic apparatus associated with the printed circuit boards by brackets (not shown). Each member has a printed circuit board guide 18 secured to one face thereof having a plurality of pairs of ridges 20 and 22 formed thereon which define guide tracks therebetween. The guide tracks of each of the guides 18 are aligned with one another to provide aligned pairs of upper and lower guide tracks for slidably receiving the upper and lower edges of each of the printed circuit boards 12 to retain them in parallel spaced apart relation as illustrated in FIG. 1. The electrical connections to the boards can be made in a number of different ways. For example, a terminal board 24 can be supported between the members 14 and 16 which has a plurality of vertically extending slots 26 in the face thereof in position to receive the leading vertical edges of the printed circuit boards 12. The leading edges of the boards can have conductive strips 28 thereon for making the necessary electrical connection to the printed circuitry on the printed circuit board, and each of the slots 26 can be provided with a plurality of complementary spring clip terminals 30 for making the necessary electrical connections to the conductive strips 28.

Figure 2:
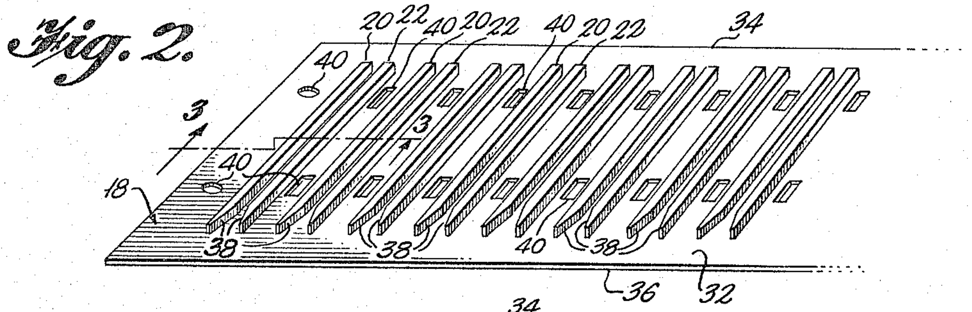
FIG. 2 is a perspective view of one of the printed circuit board guides used in the rack of FIG. 1.

As most clearly illustrated in FIGS. 2 and 3, each of the guides 18 comprises a sheet 32 of a suitable electrical insulating material such as, for example, a suitable plastic material, or a coated paper material. The plurality of pairs of ridges 20 and 22 which extend transversely across the sheet 32 are preferably formed by a draw molding operation employing suitable male and female dies to form the ridges with the rectangular cross-section as illustrated in FIG. 3. In the preferred embodiment the spacing between the pairs of ridges is greater than the width of the guide track defined by each pair of ridges, and the ends of the ridges are spaced inwardly from the side edges 34 and 36 of the sheet 32 so as to increase the rigidity of the guides 18. Spacing the ends of the ridges from the side edges of the sheet also provides additional area for securing the guides to the supports 14 and 16, either by adhesively bonding the guides to the supports or mechanically fastening them to the supports in a suitable manner. Also the ridges are tapered as at 38 to form diverging end portions at the ends of each pair of ridges to assist in guiding the printed circuit boards 12 into the guide track.

Suitable holes 40 may be formed in the sheet 32 where desired to facilitate circulation of air around and between the printed circuit boards when supported as illustrated in FIG. 1. The sheet 32 is preferably made in long strips having 20–100 guide tracks thereon, and the strips cut to length by scissors or the like to provide the individual guides having the desired number of guide tracks thereon. If the sheet 32 is made of plastic material it can be clear, translucent or opaque, depending on whether it is desired to see through the guide area or not. The plastic material may also be selected for its low friction characteristics, or a sheet having a coating of low friction material may be selected to make it easier to slide the printed circuit boards in and out of the guide tracks.

Figure 4:
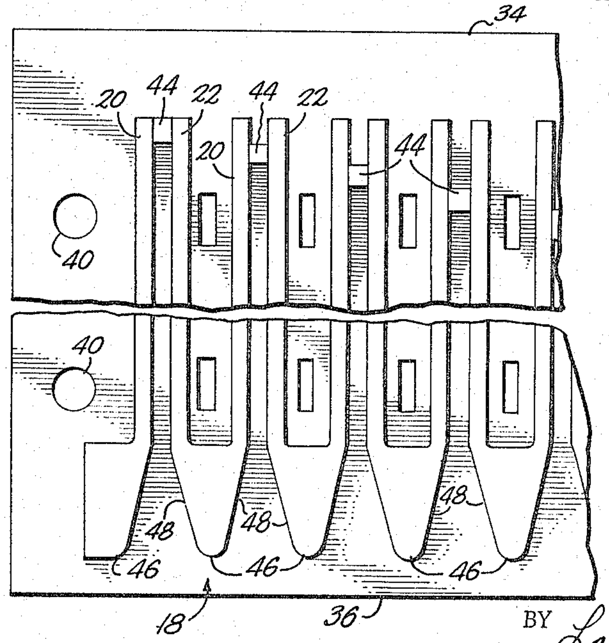
FIG. 4 is an enlarged, broken plan view of a printed circuit board guide illustrating modifications of the invention.

As illustrated in FIG. 4, a stop 44 may be positioned in each guide track at predetermined distances from the ends thereof to cooperate with suitable shoulders formed on the printed circuit boards in a manner to permit only the properly prepared circuit boards to enter into the guide track a sufficient distance to make electrical connection with the terminal board 24. Also, suitable guide elements 46 can be provided on the ends of each pair of ridges 22 and 20 defining the space between the guide tracks in a manner to prevent the printed circuit boards sliding into this space rather than into the guide tracks themselves. As illustrated in FIG. 4, the guide elements 46 are formed during the draw molding operation and have tapered sides 48 which cooperate with the tapered sides of adjacent guide elements to form the diverging end portions for guiding the printed circuit boards into the guide tracks. Of course, if desired, the guide elements could be made separately and then secured in position between the ends of the ridges to prevent the printed circuit boards from sliding into the space between the guide tracks and to guide the printed circuit boards into the guide tracks. As illustrated in FIG. 4, the stops 44 are made separately and secured in position in the guide tracks after the guide 18 has been formed. If desired, these stops could also be formed during the draw molding operation. By draw molding the guides 18, they can be mass-produced in a very economical manner, and the dimensions of the guides can be readily changed to provide any spacing or length desired by simply changing the dies.

While it will be apparent that the embodiments of the invention herein disclosed are well calculated to fulfill the objects of the invention, it will be appreciated that the invention is susceptible to modification, variation and change without departing from the proper scope or fair meaning of the subjoined claims.

What is claimed is:

1. A guide for printed circuit boards or the like comprising a sheet of electrical insulating material having a plurality of parallel spaced-apart guide tracks formed on at least one face thereof, each of said guide tracks being defined by portions of said sheet displaced outwardly from said one face of the sheet in a manner to form parallel spaced-apart ridges extending along said guide tracks to define the sides thereof, each of said ridges having a U-shaped cross-section with the legs of the U connected to said sheet, said sheet including means for restraining said legs from spreading apart.

2. The guide as defined in claim 1 wherein each pair of ridges defining a guide track therebetween have diverging end portions at one end thereof for guiding the edge of a printed circuit board into the guide track.

3. The guide as defined in claim 1 wherein the ends of said ridges are spaced inwardly from the edges of said sheet.

4. A guide for printed circuit boards or the like comprising a sheet of electrical insulating material having a plurality of parallel spaced apart guide tracks formed on at least one face thereof, each of said guide tracks being defined by portions of said sheet displaced outwardly from said one face of the sheet in a manner to form parallel spaced apart ridges extending along said guide tracks to define the sides thereof, each of said ridges having a U-shaped cross-section with the legs of the U connected to said sheet, the ends of said ridges being spaced inwardly from the edges of said sheet to form margins on the sheet extending along the ends of the ridges for restraining said legs against spreading apart, each of said guide tracks being defined by a separate pair of ridges with the adjacent ridges of each pair of ridges being spaced from one another a distance greater than the width of said guide tracks.

5. The guide as defined in claim 4 including guide means located between each of said pair of ridges at one end thereof for guiding the printed circuit boards into the guide tracks and preventing the printed circuit boards from sliding into the spaces between the pairs of ridges.

6. The guide as defined in claim 4 wherein said sheet is a non-metallic sheet having plastic on said one face, and each of said guide means is defined by a portion of said sheet displaced outwardly from said one face of the sheet and connected directly to the pair of ridges associated therewith.

7. In combination, a pair of printed circuit board guides each comprising a sheet of electrical insulating material having a plurality of parallel spaced-apart guide tracks on at least one face thereof, each of said guide tracks being defined by portions of said sheet displaced outwardly from said one face of the sheet in a manner to form parallel spaced apart ridges extending along and forming the sides of said guide tracks, and means for supporting said printed circuit board guides in parallel spaced-apart relation with each guide track of one guide aligned with a corresponding guide track of the other guide whereby each aligned pair of guide tracks can receive and position a printed circuit board therebetween, each of said ridges having a U-shaped cross-section with the legs of the U connected to said sheet, said sheet including means for restraining said legs from spreading apart.

8. The method of making a printed circuit board guide, which includes the steps of, providing an elongated sheet of an electrical insulating material, forming a plurality of ridges projecting from one face of said sheet and extending transversely thereof in parallel spaced apart relation, pairs of said ridges defining guide tracks therebetween for receiving the edge of a printed circuit board, each of said guide tracks having the same width and the spacing between the pairs of ridges being identical, and cutting said elongated sheet transversely between the pairs of ridges into predetermined lengths, each having a predetermined number of complete guide tracks thereon.

9. A guide for printed circuit boards or the like comprising a sheet of electrical insulating material having a plurality of parallel spaced apart guide tracks formed on at least one face thereof, each of said guide tracks being defined by portions of said sheet displaced outwardly from said one face of the sheet in a manner to form parallel spaced apart ridges extending along said guide tracks to define the sides thereof, a stop in each of said guide tracks, said stops being located at different longitudinal positions in the guide tracks to co-operate with shoulders located at different positions on the edges of the printed circuit boards to be supported by the guide tracks whereby only properly prepared printed circuit boards can be retained in the guide tracks in position to engage suitable electrical connecting means associated with the guide tracks.

References Cited

UNITED STATES PATENTS

| | | | |
|---|---|---|---|
| 2,899,074 | 8/1959 | Gullixson | 211—40 |
| 2,976,510 | 3/1961 | Blain | 339—17 |

| | | | |
|---|---|---|---|
| 3,231,785 | 1/1966 | Calabro | 317—100 |
| 3,271,626 | 9/1966 | Hawrilka | 339—176 |

OTHER REFERENCES

Schuster, Irwin, Eight Printed Circuit Guides, in Product Engineering, May 27, 1963, pp. 36–37.

MARVIN A. CHAMPION, *Primary Examiner.*

BOBBY R. GAY, *Examiner.*

J. H. McGLYNN, *Assistant Examiner.*